United States Patent
Shirochi et al.

(10) Patent No.: US 11,298,750 B2
(45) Date of Patent: Apr. 12, 2022

(54) COATED CUTTING TOOL

(71) Applicant: TUNGALOY CORPORATION, Fukushima (JP)

(72) Inventors: Tsukasa Shirochi, Iwaki (JP); Kinya Takahashi, Iwaki (JP); Naoyuki Fukushima, Iwaki (JP)

(73) Assignee: TUNGALOY CORPORATION, Iwaki (JP)

(*) Notice: Subject to any disclaimer, the term of this patent is extended or adjusted under 35 U.S.C. 154(b) by 102 days.

(21) Appl. No.: 16/748,619

(22) Filed: Jan. 21, 2020

(65) Prior Publication Data
US 2020/0261982 A1    Aug. 20, 2020

(30) Foreign Application Priority Data
Feb. 15, 2019   (JP) .............................. JP2019-025407

(51) Int. Cl.
*B23B 27/14*    (2006.01)
*C23C 16/34*    (2006.01)
(Continued)

(52) U.S. Cl.
CPC .......... *B23B 27/148* (2013.01); *C23C 16/308* (2013.01); *C23C 16/32* (2013.01);
(Continued)

(58) Field of Classification Search
CPC . B23B 27/14; B23B 27/148; B23B 2228/105; C23C 16/308; C23C 16/32; C23C 16/34; C23C 16/36; C23C 16/403
(Continued)

(56) References Cited

U.S. PATENT DOCUMENTS 4,357,382 A * 11/1982 Lambert .............. C23C 30/005
                                                            428/212
5,861,210 A *  1/1999 Lenander ............. C23C 16/403
                                                            428/336
(Continued)

FOREIGN PATENT DOCUMENTS

JP   H04-103754 A   4/1992
JP   H05-057507 A   3/1993
(Continued)

OTHER PUBLICATIONS

Sakari Ruppi et al., "Enhanced Performance of α-Al2O3 Coatings by Control of Crystal Orientation", Surface and Coatings Technology, vol. 202, Issue 17, May 25, 2008, pp. 4257-4269, doi:10.1016/j.surfcoat.2008.03.021.
(Continued)

*Primary Examiner* — Archene A Turner
(74) *Attorney, Agent, or Firm* — Studebaker & Brackett PC (57) ABSTRACT

Provided is a coated cutting tool of long tool life and that affords superior machined surface quality. A coated cutting tool includes a substrate, and a coating layer formed on the substrate. The coated cutting tool includes at least one flank face, at least one rake face, and a honing section rounded and connecting the flank face and the rake face. The coating layer includes a lower layer, an intermediate layer and an upper layer, in this order from the side of the substrate. The lower layer is composed of one, or two or more Ti compound layers made up of a Ti compound of Ti and at least one element selected from the group consisting of C, N, O and B. The intermediate layer contains α-type $Al_2O_3$. The upper layer contains a compound represented by following formula (1): $Ti(C_{1-x-y}N_xO_y)$ (1). An average thickness of the coating layer on the flank face side is 5.0 μm more and 30.0 μm or less. A first cross section positioned at a distance of
(Continued)

up to 1 μm towards the substrate, from an interface of the intermediate layer and the upper layer side, the cross section being parallel to an interface of the substrate and the lower layer, satisfies the condition represented by following expression (i): RSA≥40 (i). A second cross section, positioned at a distance of up to 1 μm from the interface of the upper layer and the intermediate layer side towards an interface on the opposite side, the cross section being parallel to the interface of the substrate and the lower layer, satisfies the condition represented by following expression (ii): RSB≥40 (ii). The intermediate layer is exposed at least at the honing section.

19 Claims, 3 Drawing Sheets

(51) Int. Cl.
    *C23C 16/32*     (2006.01)
    *C23C 16/30*     (2006.01)
    *C23C 16/40*     (2006.01)
    *C23C 16/36*     (2006.01)

(52) U.S. Cl.
    CPC .............. *C23C 16/34* (2013.01); *C23C 16/36* (2013.01); *C23C 16/403* (2013.01); *C23C 16/405* (2013.01); *B23B 2228/105* (2013.01)

(58) Field of Classification Search
    USPC ........................................................ 429/698
    See application file for complete search history.

(56) References Cited

U.S. PATENT DOCUMENTS

| | | | |
|---|---|---|---|
| 5,871,850 A | | 2/1999 | Moriguchi et al. |
| 10,974,324 B2* | | 4/2021 | Takahashi ............. B23B 27/148 |
| 2003/0022029 A1 | | 1/2003 | Kidama et al. |
| 2004/0202877 A1* | | 10/2004 | Martensson ............ C04B 41/89 428/469 |
| 2007/0104945 A1 | | 5/2007 | Ruppi |
| 2010/0330360 A1 | | 12/2010 | Tanibuchi et al. |
| 2014/0193624 A1 | | 7/2014 | Stiens et al. |
| 2014/0377024 A1 | | 12/2014 | Sobana et al. |
| 2017/0008092 A1 | | 1/2017 | Ruppi et al. |
| 2017/0190591 A1 | | 7/2017 | Imamura et al. |
| 2017/0275765 A1 | | 9/2017 | Stiens et al. |
| 2017/0342554 A1* | | 11/2017 | Bjormander .......... C23C 28/048 |
| 2019/0160547 A1 | | 5/2019 | Takahashi et al. |
| 2019/0283143 A1 | | 9/2019 | Satoh et al. |
| 2019/0344358 A1 | | 11/2019 | Satoh et al. |
| 2020/0189006 A1 | | 6/2020 | Satoh et al. |
| 2020/0230706 A1 | | 7/2020 | Fukushima |

FOREIGN PATENT DOCUMENTS

| | | | |
|---|---|---|---|
| JP | H06-108253 A | | 4/1994 |
| JP | H08-52603 A | | 2/1996 |
| JP | H08-158052 A | | 6/1996 |
| JP | H08-257808 A | | 10/1996 |
| JP | 2001-107237 A | | 4/2001 |
| JP | 2002-346811 | * | 12/2002 |
| JP | 2003-311510 A | | 11/2003 |
| JP | 2005-205586 A | | 8/2005 |
| JP | 2007-125686 A | | 5/2007 |
| JP | 2007-260851 A | | 10/2007 |
| JP | 2007-313636 A | | 12/2007 |
| JP | 2008-087150 A | | 4/2008 |
| JP | 2009-056538 A | | 3/2009 |
| JP | 2011-115945 A | | 6/2011 |
| JP | 2012-030308 A | | 2/2012 |
| JP | 2012-196726 A | | 10/2012 |
| JP | 2012-254523 A | | 12/2012 |
| JP | 2013-132717 A | | 7/2013 |
| JP | 2014-530112 A | | 11/2014 |
| JP | 2015-085441 A | | 5/2015 |
| JP | 2017-506163 A | | 3/2017 |
| JP | 2017-530019 A | | 10/2017 |
| JP | 2019-098430 A | | 6/2019 |
| JP | 2020-116645 A | | 8/2020 |
| WO | 2017/037796 A1 | | 3/2017 |
| WO | 2018/079228 A1 | | 5/2018 |
| WO | 2018/092518 A1 | | 5/2018 |
| WO | 2018/128003 A1 | | 7/2018 |

OTHER PUBLICATIONS

Sakari Ruppi, "Advances in cutting tool and coating technology," Vuoriteollisuus—Bergshanteringen, Issue Mar. 2002, Mar. 2002, pp. 25-33 (11 pages total), Finland.

* cited by examiner

COATED CUTTING TOOL

BACKGROUND

Field

The present invention relates to a coated cutting tool.

Description of Related Art

Coated cutting tools obtained through formation, by chemical vapor deposition, of a coating layer to a total thickness of 3 to 20 μm on the surface of a substrate made up of a cemented carbide, have conventionally been used for cutting for instance steel and cast iron. Known layers used as these coating layers include for instance coating layers having a single layer of a titanium compound, aluminum oxide ($Al_2O_3$) or the like, or having multiple layers of two or more types of the foregoing.

Patent Publication JP-A-2013-132717 shows a surface-coated cutting tool comprising a lower layer consisting of a titanium compound layer; and an upper layer consisting of an aluminum oxide layer deposited on a surface of a tool substrate constituted of a tungsten carbide-based cemented carbide as a hard coating layer, wherein, in the upper layer consisting of the aluminum oxide layer, a (006) plane texture coefficient TC (006) is 1.8 or more, a ratio I(104)/I(110) of a peak intensity I(104) of an (104) plane to a peak intensity I(110) of an (110) plane is in a range of 0.5 to 2.0, and an absolute value of a residual stress in the aluminum oxide layer is 100 MPa or less.

SUMMARY

Recent years have witnessed increases in speed, feed and depth of cut in cutting machining, and better wear resistance and fracture resistance than in conventional instances have come to be demanded in coated cutting tools. Moreover, cutting where a high load is exerted on the cutting tool, such as high-speed cutting of steel, has become widespread in recent years. Under such harsh cutting conditions, conventional cutting tools are prone to fracturing due to welding and crater wear arising from sloughing of coating layer particles. These occurrences give rise to the problem of shorter tool life.

In addition, when a cut material of a workpiece welds to a site actually involved in cutting, a problem in machined surface quality arises in that the machined surface of the workpiece is damaged, and exhibiting cloudiness.

It is an object of the present invention, arrived at in the light of the above considerations, to provide a coated cutting tool exhibiting long tool life and exhibiting superior machined surface quality.

From the above viewpoints, the inventors studied how to achieve prolongation of the tool life of the coated cutting tool, combined with machined surface quality.

The inventors found that a coated cutting tool exhibiting long tool life and exhibiting superior machined surface quality can be obtained by virtue of the fact that a coating layer of such a coated cutting tool has a lower layer, an intermediate layer and an upper layer containing predetermined materials, and wherein a below-described RSA in the intermediate layer and a below-described RSB in the upper layer are set to lie within predetermined ranges, the average thickness of the coating layer is set to lie within a predetermined range, and the intermediate layer is exposed at a honing section of the coated cutting tool.

Specifically, the present invention is as follows.

[1] A coated cutting tool comprising:
a substrate; and
a coating layer formed on the substrate,
wherein,
the coated cutting tool has at least one flank face, at least one rake face, and a honing section rounded and connecting the flank face and the rake face;
the coating layer comprises:
a lower layer;
an intermediate layer; and
an upper layer, in this order from the side of the substrate;
the lower layer has one, or two or more Ti compound layers composed of a Ti compound of Ti and at least one element selected from the group consisting of C, N, O and B;
the intermediate layer comprises α-type $Al_2O_3$;
the upper layer comprises a compound represented by following formula (1) below:

$$Ti(C_{1-x-y}N_xO_y) \quad (1)$$

wherein, x is the atomic ratio of N relative to the total of C, N and O; y is the atomic ratio of O relative to the total of C, N and O; and $0.15 \leq x \leq 0.65$ and $0 \leq y \leq 0.20$ are satisfied;

an average thickness of the coating layer on the flank face side is 5.0 μm or more and 30.0 μm or less;

a first cross section surface positioned in the intermediate layer at a distance of up to 1 μm towards the substrate, from an interface on the upper layer side, the cross section surface being parallel to an interface of the substrate and the lower layer, satisfies the condition represented by following expression (i):

$$RSA \geq 40 \quad (i)$$

wherein, RSA is the proportion (units: area %) of cross-sectional area of particles having a misorientation A of 0 degrees or more and less than 10 degrees, relative to the cross-sectional area of particles having a misorientation A of 0 degrees or more and 45 degrees or less, in the first cross section surface; and the misorientation A is an angle (units: degrees) formed by the normal line of the first cross section surface and the normal line of the (001) plane of the particles of α-type $Al_2O_3$ in the intermediate layer;

a second cross section surface, positioned in the upper layer at a distance of up to 1 μm from the interface on the intermediate layer side towards an interface on the opposite side, the cross section being parallel to the interface of the substrate and the lower layer, satisfies the condition represented by following expression (ii):

$$RSB \geq 40 \quad (ii)$$

wherein, RSB is the proportion (units: area %) of cross-sectional area of particles having a misorientation B of 0 degrees or more and less than 10 degrees, relative to the cross-sectional area of particles having a misorientation B of 0 degrees or more and 45 degrees or less, in the second cross section surface; and the misorientation B is an angle (units: degrees) formed by the normal line of the second cross section surface and the normal line of the (111) plane of the particles of the compound represented by the formula (1) in the upper layer; and the intermediate layer is exposed at least at the honing section.

[2] The coated cutting tool of [1], wherein the intermediate layer is exposed also at a region up to 3 mm from a boundary of the rake face and the honing section.

[3] The coated cutting tool of [1] or [2], wherein an average thickness of the upper layer is 1.0 μm or more and 6.0 μm or less, on the flank face side.

[4] The coated cutting tool of any one of [1] to [3], wherein an average thickness of the intermediate layer is 3.0 μm or more and 15.0 μm or less, on the flank face side.

[5] The coated cutting tool of any one of [1] to [4], wherein an average thickness of the lower layer is 3.0 μm or more and 15.0 μm or less, on the flank face side.

[6] The coated cutting tool of any one of [1] to [5], wherein the Ti compound in the Ti compound layer is at least one selected from the group consisting of TiN, TiC, TiCN, TiCNO, TiON and $TiB_2$.

[7] The coated cutting tool of any one of [1] to [6], wherein the substrate is a cemented carbide, a cermet, a ceramic or a sintered compact of cubic boron nitride.

The present invention provides a coated cutting tool exhibiting long tool life and exhibiting superior machined surface quality.

DETAILED DESCRIPTION

An embodiment for carrying out the present invention (hereafter simply referred to as "the present embodiment") will be explained in detail below, with reference to accompanying drawings as needed. However, the present invention is not limited to the present embodiment below. The present invention can accommodate various modifications without departing from the gist thereof. Unless otherwise specified, positional relationships such as top-bottom and left-right relationships in the drawings are based on the positional relationships as depicted in the drawings. The dimensional ratios in the drawings are not limited to the depicted ratios.

—Coated Cutting Tool—

The coated cutting tool of the present embodiment has a substrate, and a coating layer formed on the substrate.

The coated cutting tool has at least one flank face, at least one rake face, and a honing section rounded and connecting the flank face and the rake face.

The coating layer has a lower layer, an intermediate layer and an upper layer, in this order from the side of the substrate.

The lower layer contains one, or two or more Ti compound layers composed of a Ti compound of Ti and at least one element selected from the group consisting of C, N, O and B; the intermediate layer comprises α-type $Al_2O_3$, and the upper layer comprises a compound represented by following formula (1):

$$Ti(C_{1-x-y}N_xO_y) \quad (1)$$

wherein, x is the atomic ratio of N relative to the total of C, N and O; y is the atomic ratio of O relative to the total of C, N and O; and $0.15 \le x \le 0.65$ and $0 \le y \le 0.20$ are satisfied.

The average thickness of the coating layer on the flank face side is 5.0 μm or more and 30.0 μm or less.

A first cross section surface positioned in the intermediate layer at a distance of up to 1 μm towards the substrate, from an interface on the upper layer side, the cross section surface being parallel to an interface of the substrate and the lower layer, satisfies the condition represented by following expression (i):

$$RSA \ge 40 \quad (i)$$

wherein, RSA is the proportion (units: area %) of cross-sectional area of particles having a misorientation A of 0 degrees or more and less than 10 degrees, relative to the cross-sectional area of particles having a misorientation A of 0 degrees or more and 45 degrees or less, in the first cross section surface; and the misorientation A is an angle (units: degrees) formed by the normal line of the first cross section surface and the normal line of the (001) plane of the particles of α-type $Al_2O_3$ in the intermediate layer.

A second cross section surface, positioned in the upper layer at a distance of up to 1 μm from the interface on the intermediate layer side towards an interface on the opposite side, the cross section being parallel to the interface of the substrate and the lower layer, satisfies the condition represented by following expression (ii):

$$RSB \ge 40 \quad (ii)$$

wherein, RSB is the proportion (units: area %) of cross-sectional area of particles having a misorientation B of 0 degrees or more and less than 10 degrees, relative to the cross-sectional area of particles having a misorientation B of 0 degrees or more and 45 degrees or less, in the second cross section; and the misorientation B is an angle (units: degrees) formed by the normal line of the second cross section surface and the normal line of the (111) plane of the particles of the compound represented by the formula (1) in the upper layer.

The intermediate layer is exposed at least at the honing section.

A coated cutting tool exhibiting long tool life and exhibiting superior machined surface quality can be provided, due to the coated cutting tool of the present embodiment having the above configuration.

The factors underlying the effect elicited by the coated cutting tool of the present embodiment are not certain, but are considered to include the following. The present invention however is not meant to be limited in any way by the factors expounded below.

It is considered that enhanced wear resistance and enhanced crater wear resistance are underlying factors of the long tool life exhibited by the coated cutting tool of the present embodiment.

It is considered that the wear resistance of the coated cutting tool of the present embodiment is improved by the average thickness of the coating layer of 5.0 μm or more, and that adhesion of the coating layer and the substrate is enhanced and fracture resistance is improved by the average thickness of the coating layer of 30.0 μm or less.

The intermediate layer contains α-type $Al_2O_3$. When the below-described RSA is equal to or more than a predetermined value, the intermediate layer contains rich α-type $Al_2O_3$ particles oriented in the (001) plane. The intermediate layer having that configuration exhibits superior heat resistance, and thus it is considered that the coated cutting tool exhibits as a result excellent crater wear resistance, and improved wear resistance.

When α-type $Al_2O_3$ particles oriented in the (001) plane are contained richly, a concern arises in that particles may fall under cutting conditions such that a load acts upon the coated cutting tool. The coated cutting tool of the present embodiment has therefore, on the surface of the intermediate layer, an upper layer that contains rich particles of a compound represented by Formula (1) [$Ti(C_{1-x-y}N_xO_y)$], oriented in the (111) plane, and for which a below-described RSB is equal to or more than a predetermined value. In consequence, adhesion between the upper layer and the intermediate layer is excellent, which in turn allows suppressing falling of α-type $Al_2O_3$ particles, and it is considered that wear resistance and fracture resistance are enhanced as a result.

Moreover, the intermediate layer of the coated cutting tool of the present embodiment is exposed at least at the honing section. It was found that through exposure of the intermediate layer at the portion of contact with the workpiece, during cutting, workpiece welding is scant, and machined surface quality is improved.

Figure 1:
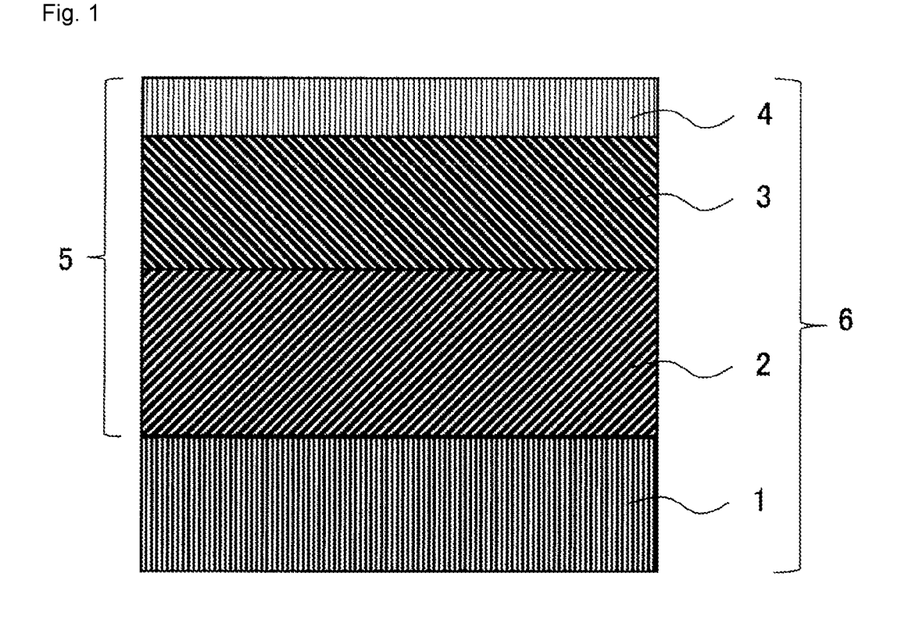
FIG. 1 is a schematic cross-sectional diagram illustrating an example of a coated cutting tool of the present embodiment.

FIG. 1 is a cross-sectional schematic diagram illustrating an example of a coated cutting tool of the present embodiment. The coated cutting tool 6 is provided with a substrate 1 and a coating layer 5 formed on the surface of the substrate 1. The coating layer 5 is stack of a lower layer 2, an intermediate layer 3 and an upper layer 4 laid upon the surface side of the substrate, in this order from the substrate.

Figure 2:
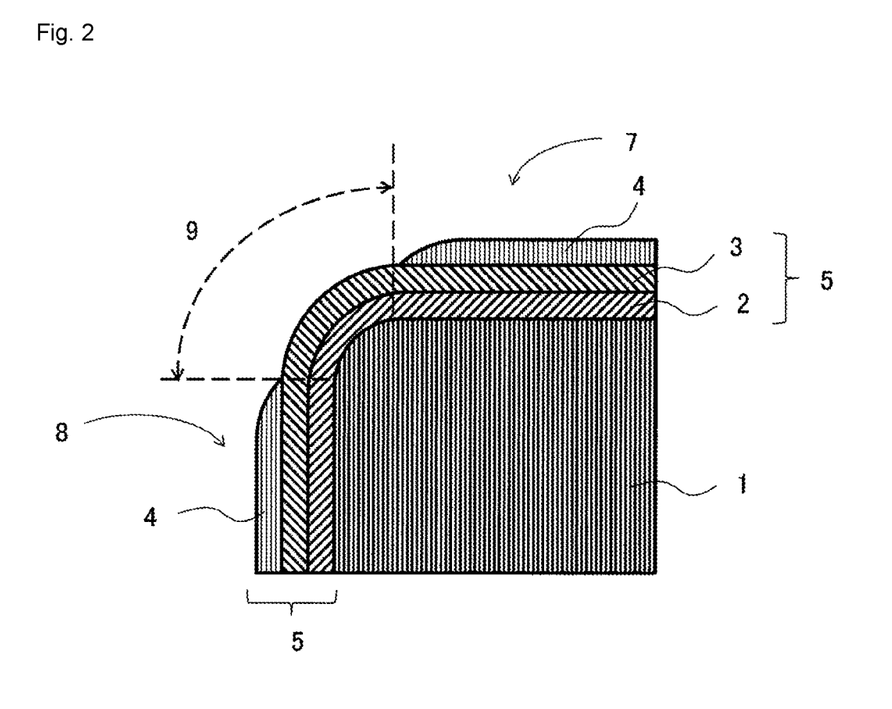
FIG. 2 is a cross-sectional schematic diagram illustrating an example of a coated cutting tool of the present embodiment.

FIG. 2 is a cross-sectional schematic diagram illustrating an example of a coated cutting tool of the present embodiment. The coated cutting tool 6 has a rake face 7, a flank face 8 and a honing section 9. The honing section 9 links the rake face 7 and the flank face 8, and is rounded.

The coating layer 5 is formed on the surface of the substrate 1, and the intermediate layer 3 is exposed at the honing section 9. The coating layer 5 has the lower layer 2, the intermediate layer 3 and the upper layer 4, at the rake face 7 and at the flank face 8. The intermediate layer 3 of the present embodiment contains α-type $Al_2O_3$, and in consequence reaction with the workpiece is suppressed to a greater extent than for instance in a case where TiCN or TiCNO is used in the upper layer 4. It is deemed that, as a result, welding can be suppressed when the intermediate layer 3 is exposed at the honing section 9. Upon welding of the workpiece to the honing section 9, the machined surface and the welded workpiece come into contact, and it is found that as a result the machined surface becomes damaged, exhibiting cloudiness. Machined surface quality at the honing section 9 is improved therefore through exposure of the intermediate layer 3.

The intermediate layer 3 is exposed also at a region up to 3 mm from the boundary of the rake face 7 and the honing section 9. Welding actually occurs not only at the honing section 9, but also up to 3 mm from the boundary of the rake face 7 and the honing section 9. Machined surface quality improves through exposure of the intermediate layer 3 also within that area.

The coated cutting tool 6 is brought into contact with the workpiece at the rake face 7 and the honing section 9, whereupon the cut workpiece is shed outward from the flank face 8.

Figure 3:
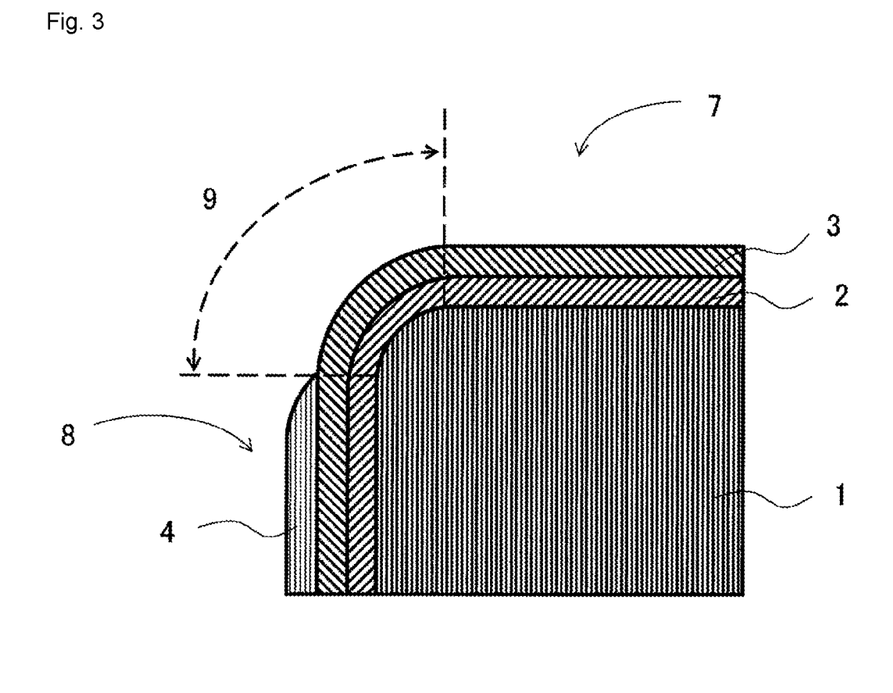
FIG. 3 is a cross-sectional schematic diagram illustrating an example of a coated cutting tool of the present embodiment.

FIG. 3 is a cross-sectional schematic diagram illustrating an example of a coated cutting tool of the present embodiment. As illustrated in FIG. 3, the intermediate layer 3 of the coated cutting tool 6 may be exposed also at the rake face 7.

The coated cutting tool of the present embodiment includes a substrate and a coating layer formed on the surface of the substrate. Specific examples of types of coated cutting tool include indexable cutting inserts for milling or turning, drills, and end mills.

——Substrate——

The substrate used in the present embodiment is not particularly limited, so long as it may be used as a substrate of a coated cutting tool. Examples of such substrate include cemented carbides, cermets, ceramics, sintered compact of cubic boron nitrides, diamond sintered compacts and high-speed steel. Preferred among the foregoing are cemented carbide, cermets, ceramics and sintered compact of cubic boron nitrides, and more preferably cemented carbide, in terms of achieving yet better wear resistance and fracture resistance.

The surface of the substrate may be modified. In a case where the substrate is made up of cemented carbide, a β-free layer may be formed on the surface of the substrate. In a case where the substrate is made up of a cermet, a hardened layer may be formed on the surface of the substrate. The effect of the present invention is elicited even when the surface of the substrate is modified.

——Coating Layer——

The average thickness of the coating layer used in the present embodiment is 5.0 μm or more and 30.0 μm or less, on the flank face side. When the average thickness of the coating layer of the coated cutting tool of the present embodiment is 5.0 μm or more, wear resistance increases, while when the average thickness of the coating layer is 30.0 μm or less, adhesion of the coating layer and the substrate is enhanced, and fracture resistance improves. From the same viewpoints, the average thickness of the coating layer is preferably 10.0 μm or more and 27.0 μm or less, more preferably 12.0 μm or more and 25.5 μm or less, yet more preferably 13.0 μm or more and 20.0 μm or less, and even yet more preferably 14.9 μm or more and 19.3 μm or less.

The average thickness of the entire coating layer of the coated cutting tool of the present embodiment can be worked out by measuring the thickness of the coating layer as a whole, from three or more cross sections on the flank face side, and by calculating the arithmetic mean value of the measured thickness values.

——Lower Layer——

The lower layer used in the present embodiment contains one, or two or more Ti compound layers made up of a Ti compound of Ti and at least one element selected from the group consisting of C, N, O and B. The wear resistance and adhesion of the coated cutting tool are improved when the coated cutting tool has a lower layer provided between the substrate and the intermediate layer containing α-type $Al_2O_3$.

The Ti compound layer is not particularly limited. For instance, the Ti compound layer may be a TiC layer consisting of TiC, a TiN layer consisting of TiN, a TiCN layer consisting of TiCN, a TiCO layer consisting of TiCO, a TiCNO layer consisting of TiCNO, a TiON layer consisting of TiON, or a $TiB_2$ layer consisting of $TiB_2$.

The lower layer may be configured in the form of one layer, or of multiple layers (for instance two layers or three layers). A multilayer configuration is preferable herein; more preferably, the lower layer is made up of two or three layers, and yet more preferably of three layers. The Ti compound that makes up the Ti compound layer contained in the lower layer is preferably at least one compound selected from the group consisting of TiN, TiC, TiCN, TiCNO, TiON and $TiB_2$, from the viewpoint of further improving wear resistance and adhesion. At least one layer of the lower layer is a TiCN layer, since in that case wear resistance is further enhanced. In a case where the lower layer is configured out of three layers, a TiC layer or a TiN layer may be formed as a first layer on the surface of the substrate, a TiCN layer may be formed as a second layer on the surface of the first layer, and then a TiCNO layer or TiCO layer may be formed as a third layer on the surface of the second layer. Among the foregoing, a TiN layer may be formed as a first layer on the surface of the substrate, a TiCN layer may be formed as a second layer on the surface of the first layer, and a TiCNO layer may be formed as a third layer on the surface of the second layer.

The average thickness of the lower layer used in the present embodiment is preferably 3.0 μm or more and 15.0 μm or less, on the flank face side. The wear resistance of the coated cutting tool of the present embodiment is enhanced by virtue of the fact that the average thickness of the lower layer is 3.0 μm or more. The fracture resistance of the coated cutting tool of the present embodiment is improved, mainly through suppression of peeling of the coating layer, by virtue of the fact that the average thickness of the lower layer is 15.0 μm or less. From the same viewpoints as above, the average thickness of the lower layer is preferably 3.5 μm or more and 13.0 μm or less, more preferably 4.0 μm or more and 12.5 μm or less, and yet more preferably 5.0 μm or more and 11.0 μm or less, on the flank face side.

The average thickness of the lower layer preferably lies within the above ranges also on the rake face side and on the honing section side. The values of thickness of the various materials explained below have likewise identical preferred ranges on the flank face side, the rake face side and the honing section side.

The average thickness of the TiC layer and TiN layer is preferably 0.05 μm or more and 1.0 μm or less, from the viewpoint of further improving wear resistance and fracture resistance. From the same viewpoint, the average thickness of the TiC layer and the TiN layer is preferably 0.10 μm or more and 0.5 μm or less, and more preferably 0.15 μm or more and 0.3 μm or less.

The average thickness of the TiCN layer is preferably 2.0 μm or more and 20.0 μm or less, from the viewpoint of further improving wear resistance and fracture resistance. From the same viewpoint, the average thickness of the TiCN layer is more preferably 2.5 μm or more and 15.0 μm or less, and yet more preferably 4.5 μm or more and 12.0 μm or less.

The average thickness of the TiCNO layer and TiCO layer is preferably 0.1 μm or more and 1.0 μm or less, from the viewpoint of further improving wear resistance and fracture resistance. From the same viewpoint, the average thickness of the TiCNO layer and the TiCO layer is more preferably 0.2 μm or more and 0.5 μm or less.

The Ti compound layer is a layer made up of a Ti compound of Ti and at least one element selected from the group consisting of C, N, O and B, but may contain very small amounts of components other than the above elements, so long as the effect of the lower layer can be elicited.

———Intermediate Layer———

The intermediate layer used in the present embodiment contains α-type $Al_2O_3$.

A first cross section surface of the intermediate layer used in the present embodiment, positioned at a distance of up to 1 μm towards the substrate, from the interface of the intermediate layer and the upper layer side, the cross section being parallel to the interface of the substrate and the lower layer, satisfies the condition represented by following expression (i):

$$RSA \geq 40 \tag{i}$$

wherein, RSA is the proportion (units: area %) of cross-sectional area of particles having a misorientation A of 0 degrees or more and less than 10 degrees, relative to the cross-sectional area of particles having a misorientation A of 0 degrees or more and 45 degrees or less in the first cross section surface, the misorientation A is an angle (units: degrees) formed by the normal line of the first cross section surface and the normal line of the (001) plane of the particles of α-type $Al_2O_3$ in the intermediate layer.

The crater wear resistance of the coated cutting tool of the present embodiment is increased by virtue of the fact that RSA is 40 area % or more, and hence the wear resistance of the coated cutting tool can be accordingly improved. From the same viewpoint, RSA is preferably 43 area % or more, preferably 50 area % or more and more preferably 60 area % or more. The upper limit of RSA is not particularly restricted, and may be for instance 80 area % or lower.

Herein RSA can be calculated in accordance with the method described in the examples.

The average thickness of the intermediate layer used in the present embodiment is preferably 3.0 μm or more and 15.0 μm or less, on the flank face side. When the average thickness of the intermediate layer is 3.0 μm or more, crater wear resistance on the rake face of the coated cutting tool tends to further increase, whereas when the average thickness of the intermediate layer is 15.0 μm or less, peeling of the coating layer is suppressed, and the fracture resistance of the coated cutting tool tends to further increase. From the same viewpoints, the average thickness of the intermediate layer is more preferably 3.0 μm or more and 12.0 μm or less, and yet more preferably 3.0 μm or more and 10.0 μm or less, on the flank face side.

The average thickness of the intermediate layer preferably lies within the above ranges also on the rake face side and on the honing section side. In the case of processing for removing the upper layer at the rake face, the average thickness of the intermediate layer on the rake face side may be set to be smaller than the average thickness of the intermediate layer on the flank face side.

It suffices that the intermediate layer has a layer made up of an α-type $Al_2O_3$ (α-type aluminum oxide), but so long as the effect of the present invention can be elicited, the intermediate layer may optionally contain components other than α-type $Al_2O_3$.

———Upper Layer———

The upper layer used in the present embodiment contains a compound represented by following formula (1):

$$Ti(C_{1-x-y}N_xO_y) \tag{1}$$

wherein, x is the atomic ratio of N relative to the total of C, N and O; y is the atomic ratio of O relative to the total of C, N and O; and $0.15 \leq x \leq 0.65$ and $0 \leq y \leq 0.20$ are satisfied.

A second cross section in the upper layer used in the present embodiment, positioned at a distance of up to 1 μm from the interface of the upper layer and the intermediate layer towards an interface on the opposite side, the cross section being parallel to the interface of the substrate and the lower layer, satisfies the condition represented by following expression (ii):

$$RSB \geq 40 \tag{ii}$$

wherein, RSB is the proportion (units: area %) of cross-sectional area of particles, in the second cross section, having a misorientation B of 0 degrees or more and less than 10 degrees, relative to the cross-sectional area of particles having a misorientation B of 0 degrees or more and 45 degrees or less, the misorientation B being the angle (units:

degrees) formed by the normal line of the second cross section and the normal line of the (111) plane of the particles of the compound represented by the formula (1) in the upper layer.

In the coated cutting tool of the present embodiment, fall of α-type $Al_2O_3$ particles can be suppressed by the subject matter that RSB is 40 area % or more, and hence the wear resistance and fracture resistance of the coated cutting tool are improved. From the same viewpoint, RSB is preferably 45 area % or more, and more preferably 50 area % or more. The upper limit of RSB is not particularly restricted, and may be for instance 75 area % or less.

Herein RSB can be calculated in accordance with the method described in the examples.

The average thickness of the upper layer used in the present embodiment is preferably 1.0 μm or more and 6.0 μm or less, on the flank face side. By the subject matter that the average thickness is 1.0 μm or more, the effect of suppressing fall of α-type $Al_2O_3$ particles tends to be more pronounced, and by the subject matter that the average thickness of the upper layer is 6.0 μm or less, fracture resistance tends to be further enhanced. From the same viewpoints, the average thickness of the upper layer is more preferably 1.4 μm or more and 5.8 μm or less, on the flank face side.

In a case where the upper layer is on the rake face side, the average thickness of the upper layer lies preferably within the above range, also on the rake face side.

When x in the compound represented by the formula (1) used in the upper layer is 0.15 or more, toughness is increased, and fracture resistance tends to be further enhanced as a result. When by contrast x is 0.65 or less, the contents of C and O increase relatively, and hence hardness increases, and reactive wear can be suppressed; as a result, wear resistance and oxidation resistance tend to be further enhanced. From the same viewpoints, x in following formula (1) is preferably 0.18 or more and 0.50 or less, and more preferably 0.20 or more and 0.40 or less.

When y in the compound represented by the formula (1) used in the upper layer is 0.20 or less, the contents of C and N increase relatively, and hence hardness increases and toughness improves, as a result of which wear resistance and oxidation resistance tend to be further enhanced. From the same viewpoints, yin Formula (1) is preferably 0.01 or more and 0.18 or less, and more preferably 0.03 or more and 0.15 or less. When y is 0.01 or more, there can be suppressed falling of particles of the α-type $Al_2O_3$ layer, mainly due to better adhesion, and as a result wear resistance and fracture resistance are improved.

It suffices that the upper layer has a layer made up of the compound represented by the formula (1), but so long as the effect of the present invention is elicited, the upper layer may optionally contain components different from the compound represented by the formula (1).

——Outermost Layer——

The coating layer used in the present embodiment may contain an outermost layer on the upper layer, on the reverse side from that of the substrate (i.e. on the surface of the upper layer). Preferably, the outermost layer is a layer of a compound made up of at least one element selected from the group consisting of Ti, Zr, Hf, V, Nb, Ta, Cr, Mo, W, Al, Si and Y, and at least one element selected from the group consisting of C, N, O and B (preferably N), since in that case yet superior wear resistance is achieved. From the same viewpoint, the outermost layer is more preferably a layer of a compound made up of at least one element selected from the group consisting of Ti, Nb, Cr, Al and Si, and at least one element selected from the group consisting of C, N, O and B (preferably N), yet more preferably a layer of a compound made up of N and at least one element selected from the group consisting of Ti, Cr, Al and Si, and even yet more preferably a TiN layer containing TiN.

The average thickness of the outermost layer in the present embodiment is preferably 0.1 μm or more and 1.0 μm or less, on the flank face side. Wear resistance tends to become yet better when the average thickness of the outermost layer lies in the above range. From the same viewpoint, the average thickness of the outermost layer is preferably 0.1 μm or more and 0.5 μm or less.

In a case where the outermost layer is on the rake face side, the average thickness of the outermost layer lies preferably within the above range, also on the rake face side.

——Method for Forming Coating Layer——

For instance the method below will be illustrated as a method for forming the various layers that make up the coating layer of the coated cutting tool of the present embodiment. The method for forming the layers is however not limited thereto.

For instance, a Ti compound layer made up of a Ti nitride layer (hereafter also referred to as "TiN layer") can be formed, using a starting material composition of $TiCl_4$: 5.0 to 10.0 mol %, $N_2$: 20 to 60 mol % and $H_2$: balance, by chemical vapor deposition, with temperature set to 850° C. to 1050° C. and pressure set to 300 to 400 hPa.

For instance, a Ti compound layer made up of a Ti carbide layer (hereafter also referred to as "TiC layer") can be formed, using a starting material composition of $TiCl_4$: 1.5 to 3.5 mol %, $CH_4$: 3.5 to 5.5 mol % and $H_2$: balance, by chemical vapor deposition, with temperature set to 950° C. to 1050° C. and pressure set to 70 to 80 hPa.

For instance, a Ti compound layer made up of a Ti carbonitride layer (hereafter also referred to as "TiCN layer") can be formed, using a starting material composition of $TiCl_4$: 5.0 to 7.0 mol %, $CH_3CN$: 0.5 to 1.5 mol % and $H_2$: balance, by chemical vapor deposition, with temperature set to 800° C. to 900° C. and pressure set to 60 to 80 hPa.

For instance, a Ti compound layer made up of a Ti oxycarbonitride layer (hereafter also referred to as "TiCNO layer") in the lower layer can be formed, using a starting material composition of $TiCl_4$: 3.0 to 4.0 mol %, CO: 0.5 to 1.0 mol %, $N_2$: 30 to 40 mol % and $H_2$: balance, by chemical vapor deposition, with temperature set to 950° C. to 1050° C. and pressure set to 50 to 150 hPa.

For instance, a Ti compound layer made up of a Ti oxycarbide layer (hereafter also referred to as "TiCO layer") can be formed, using a starting material composition of $TiCl_4$: 1.0 to 2.0 mol %, CO: 2.0 to 3.0 mol % and $H_2$: balance, by chemical vapor deposition, with temperature set to 950° C. to 1050° C. and pressure set to 50 to 150 hPa.

The intermediate layer containing α-type $Al_2O_3$ can be formed for instance in accordance with the method below.

Firstly, a lower layer made up of one or more Ti compound layers is formed on the surface of a substrate. Next, the surface of the layer farthest from the substrate is oxidized. Thereafter, nuclei of α-type $Al_2O_3$ are formed on the surface of the layer farthest from the substrate, and α-type $Al_2O_3$ is formed thereupon, in a state where nuclei thereof have been formed.

More specifically, the surface of the layer farthest from the substrate is oxidized under conditions of starting material composition set to CO: 0.1 to 0.3 mol %, $CO_2$: 0.3 to 1.0 mol %, $H_2$: balance, temperature set to 950° C. to 1050° C., and pressure set to 50 to 60 hPa (oxidation step). The oxidation treatment time herein is preferably 1 to 3 minutes.

Thereafter, nuclei of α-type $Al_2O_3$ are formed by chemical vapor deposition, using a starting material composition of $AlCl_3$: 1.0 to 4.0 mol %, CO: 0.05 to 2.0 mol %, $CO_2$: 1.0 to 3.0 mol %, HCl: 2.0 to 3.0 mol % and $H_2$: balance, with temperature set to 880° C. to 930° C., and pressure set to 60 to 80 hPa (nuclei formation step).

Then α-type $Al_2O_3$ is formed by chemical vapor deposition, using a starting material composition of $AlCl_3$: 2.0 to 5.0 mol %, $CO_2$: 2.5 to 4.0 mol %, HCl: 2.0 to 3.0 mol %, $H_2S$: 0.15 to 0.25 mol % and $H_2$: balance, and temperature set to 950° C. to 1000° C. and pressure set to 60 to 80 hPa (film formation step).

In order to make RSA (area %) equal to or more than a specific value, there may be controlled the oxidation treatment time in the oxidation step, or the proportion of CO in a gas composition, in the oxidation step and/or nuclei formation step, or the film formation temperature in the film formation step. More specifically RSA can be increased, as a result of an increase in the proportion (area %) of the particles having an angle misorientation A lying in a specific range, by prolonging the oxidation treatment time in the oxidation step, or by increasing the proportion of CO in the gas composition in the oxidation step and/or nuclei formation step, or by increasing the film formation temperature in the film formation step to be higher than the nuclei formation temperature in the nuclei formation step.

An upper layer made up of a Ti oxycarbonitride layer (hereafter also referred to as "TiCNO layer") is formed on the surface of the intermediate layer.

The TiCNO layer in the upper layer can be formed, using a starting material composition of $TiCl_4$: 4.0 to 8.0 mol %, $CH_3CN$: 0.3 to 2.5 mol %, $C_2H_4$: 0 to 2.0 mol %, CO: 0 to 3.5 mol %, $N_2$: 1.0 to 25.0 mol % and $H_2$: balance, by chemical vapor deposition, with temperature set to 950° C. to 1050° C. and pressure set to 60 to 80 hPa (upper layer formation step).

In order to make RSB (area %) equal to or greater than a specific value, there may be controlled the temperature, and/or the proportion of $CH_3CN$ in the starting material composition, in the upper layer formation step. More specifically, RSB (area %) can be increased by raising the temperature and/or increasing the proportion of $CH_3CN$ in the starting material composition, in the upper layer formation step.

The starting material composition may be adjusted as appropriate in order to control the atom composition of the compound represented by the formula (1). More specifically, for instance a method that involves increasing the proportion of CO in the starting material composition may be resorted to in order to increase the proportion of carbon (C) in the atom composition of the compound represented by the formula (1).

The thickness of each layer in the coating layer of the coated cutting tool of the present embodiment can be measured through observation of a cross-sectional structure of the coated cutting tool, using for instance an optical microscope, a scanning electron microscope (SEM), or by FE-SEM. The average thickness of each layer in the coated cutting tool of the present embodiment can be worked out in the form of the arithmetic mean value of measurements of the thickness of each layer at three or more locations, in the vicinity of a position at 50 μm from a cutting edge towards the central portion of the flank face of the coated cutting tool. The compositions of the layers can be measured using for instance an energy-dispersive X-ray spectrometer (EDS) or a wavelength-dispersive X-ray spectrometer (WDS), on the basis of the cross-sectional structure of the coated cutting tool of the present embodiment.

Examples

The present invention will be explained next by way of examples, but the present invention is not meant to be limited to the examples.

Substrate

The cutting edge ridgeline of each substrate below was rounded by honing using a SiC brush, after which the surface of the substrate was washed, to use the substrate.

Substrate 1

Shape: CNMG120412

Material: cemented carbide (84.4WC-10.8Co-1.9TiC-0.2TiN-2.4NbC-0.3ZrC (mass %))

Substrate 2

Shape: CNMG120412

Material: cemented carbide (93.5WC-6.1Co-0.4$Cr_3C_2$ (mass %))

Method for Measuring RSA and RSB

To measure RSA and RSB, the cross section surfaces below were observed using a field-emission scanning electron microscope (hereafter referred to as "FE-SEM") under the conditions below, and the total ($RSA_{Total}$ or $RSB_{Total}$) particle cross-sectional areas in which the cross sections have the misorientations within a range of 0 degrees or more and 45 degrees or less was measured in accordance with the "Method for Measuring Particle Cross Sections Having Specific Misorientation" set out below, using an electron backscattering diffraction analysis device (hereafter referred to as "EBSD") attached to the FE-SEM.

The cross-sectional areas of particles having a misorientation in the range of 0 degrees or more and 45 degrees or less were classified into divisions of 5-degree pitch, and the particle cross-sectional areas in each division were calculated. Next, the total of particle cross-sectional areas for respective divisions was calculated, i.e. for a division with misorientation of 0 degrees or more and less than 10 degrees, a division with misorientation of 10 degrees or more and less than 20 degrees, a division with misorientation of 20 degrees or more and less than 30 degrees, and a division with misorientation of 30 degrees or more and 45 degrees or less. The total of particle cross-sectional areas with misorientation from 0 degrees to 45 degrees is herein 100 area %.

Then each of RSA and RSB was the proportion of the cross-sectional area of particles having a misorientation within a range of 0 degrees or more and less than 10 degrees, with respect to the total of particle cross-sectional areas of cross sections having a misorientation within a range of 0 degrees or more and 45 degrees or less.

——Conditions——

RSA

Measurement plane: first plane (plane positioned in the intermediate layer at a distance of 0.5 μm towards the substrate, from the interface on the upper layer side, and being parallel to the interface of the substrate on the lower layer side)

Method for machining the measurement surface: the surface was polished using a diamond paste until exposure of the measurement plane, to yield a mirror-surface polished surface.

Misorientation: misorientation A (angle (units: degrees) formed by the normal line of the first cross section and the normal line of the (001) plane of α-type $Al_2O_3$ particles)

RSB

Measurement plane: second plane (plane positioned in the upper layer at a distance of 0.5 µm from the interface on the intermediate layer side, towards an interface on the opposite side, and being parallel to the interface of the substrate on the lower layer side)

Method for machining the measurement surface: the surface was polished using a diamond paste until exposure of the measurement plane, to yield a mirror-surface polished surface.

Misorientation: misorientation B (angle (units: degrees) formed by the normal line of the second cross section and the normal line of the (111) plane of particles of the compound represented by the Formula (1) in the second cross section)

——Method for Measuring Particle Cross Sections Having Specific Misorientation——

Each sample was set in a FE-SEM. The sample was then irradiated with an electron beam, at an incidence angle of 70 degrees, and at an acceleration voltage of 15 kV and an irradiation current of 1.0 nA. Within a measurement range of 30 µm×50 µm, the misorientation and cross-sectional area of each particle were measured, with a 0.1 µm step size, in EBSD settings. The particle cross-sectional areas of the intermediate layer within the measurement range was herein the sum total of pixels corresponding to that surface area. Specifically, total of particle cross-sectional areas of divisions for each 10-degree or 15-degree pitch based on misorientation A, of the particles of each layer, was calculated by totaling the pixels taken up by particle cross sections corresponding to respective divisions, and converting the result into surface area.

—Method for Measuring Layer Thickness—

The thickness at three locations at a cross section in the vicinity of a position at 50 µm from the cutting edge ridgeline of the coated cutting tool towards the central portion of the flank face was measured by FE-SEM, and the arithmetic mean value of the measured thickness values was calculated as the average thickness. The compositions of the layers in each obtained sample were measured by EDS at a cross section in the vicinity of a position at 50 µm from the cutting edge ridgeline of the coated cutting tool towards the central portion of the flank face.

—Invention Products 1 to 20 and Comparative Products 1 to 11—

A coating layer was formed on the substrate 1 and the substrate 2 by chemical vapor deposition. Firstly, each substrate was charged into a chemical vapor deposition device of external heating type, and a first layer having the composition given in Table 6, was formed on the surface of the substrate, to the average thickness given in Table 6, under the conditions of starting material composition, temperature and pressure set out in Table 1. Next, a second layer having the composition given in Table 6 was formed on the surface of the first layer, to the average thickness given in Table 6, under the conditions of starting material composition, temperature and pressure set out in Table 1. Next, a third layer having the composition given in Table 6, was formed on the surface of the second layer, to the average thickness given in Table 6, under the conditions of starting material composition, temperature and pressure set out in Table 1. As a result there was formed a lower layer made up of three layers. Thereafter, the surface of the third layer was subjected to an oxidation treatment for the duration given in Table 2, under conditions of composition, temperature and pressure given in Table 2. Next, nuclei of α-type aluminum oxide (α-type $Al_2O_3$) were formed on the surface of the third layer, having undergone the oxidation treatment, under the conditions of starting material composition, temperature and pressure given in Table 3. Further, an intermediate layer (α-type $Al_2O_3$ layer) having the composition given in Table 6 was formed, to the average thickness given in Table 6, on the third layer and on the nuclei of the α-type aluminum oxide (α-type $Al_2O_3$), under conditions of starting material composition, temperature and pressure given in Table 4. Next, an upper layer having the composition given in Table 6, was formed on the surface of the α-type $Al_2O_3$ layer, to the average thickness given in Table 6, under the conditions of starting material composition, temperature and pressure set out in Table 5. Further, an outermost layer having the composition given in Table 6 was formed on the surface of the upper layer, to the average thickness given in Table 6, under the conditions of starting material composition, temperature and pressure given in Table 2, for Invention products 1 to 5, 12 to 14 and 16 to 20, and Comparative products 1, 2 and 9 to 11. Coating layers were formed so that the layers exposed at respective faces and portions of the substrate were as given in Table 8. Coated cutting tools of Invention products 1 to 20 and of Comparative products 1 to 11 were thus obtained.

TABLE 1

|  | Layer composition | Temperature (° C.) | Pressure (hPa) | Starting material composition (mol %) |
|---|---|---|---|---|
| Lower layer | TiN | 900 | 350 | $TiCl_4$: 7.5%, $N_2$: 40.0%, $H_2$: 52.5% |
|  | TiC | 1000 | 75 | $TiCl_4$: 2.4%, $CH_4$: 4.6%, $H_2$: 93.0% |
|  | TiCN | 850 | 70 | $TiCl_4$: 6.0%, $CH_3CN$: 1.0%, $H_2$: 93.0% |
|  | TiCNO | 1000 | 100 | $TiCl_4$: 3.5%, CO: 0.7%, $N_2$: 35.5%, $H_2$: 60.3% |
|  | TiCO | 1000 | 80 | $TiCl_4$: 1.5%, CO: 2.5%, $H_2$: 96.0% |
| Outermost layer | TiN | 1000 | 350 | $TiCl_4$: 7.5%, $N_2$: 40.0%, $H_2$: 52.5% |

TABLE 2

|  | Oxidation treatment | | | | | |
|---|---|---|---|---|---|---|
|  | Temperature (° C.) | Pressure (hPa) | Starting material composition (mol %) | | | Time (min) |
|  |  |  | CO | $CO_2$ | $H_2$ |  |
| Invention product 1 | 1000 | 55 | 0.3 | 0.5 | 99.2 | 2 |
| Invention product 2 | 1000 | 55 | 0.1 | 0.5 | 99.4 | 2 |
| Invention product 3 | 1000 | 55 | 0.3 | 0.5 | 99.2 | 3 |
| Invention product 4 | 1000 | 55 | 0.3 | 0.5 | 99.2 | 2 |
| Invention product 5 | 1000 | 55 | 0.3 | 0.5 | 99.2 | 2 |
| Invention product 6 | 1000 | 55 | 0.3 | 0.5 | 99.2 | 2 |
| Invention product 7 | 1000 | 55 | 0.3 | 0.5 | 99.2 | 2 |
| Invention product 8 | 1000 | 55 | 0.3 | 0.5 | 99.2 | 2 |
| Invention product 9 | 1000 | 55 | 0.3 | 0.5 | 99.2 | 2 |
| Invention product 10 | 1000 | 55 | 0.3 | 0.5 | 99.2 | 2 |
| Invention product 11 | 1000 | 55 | 0.3 | 0.5 | 99.2 | 2 |
| Invention product 12 | 1000 | 55 | 0.3 | 0.5 | 99.2 | 2 |
| Invention product 13 | 1000 | 55 | 0.3 | 0.5 | 99.2 | 2 |
| Invention product 14 | 1000 | 55 | 0.3 | 0.5 | 99.2 | 2 |

TABLE 2-continued

| | Oxidation treatment | | | | | |
|---|---|---|---|---|---|---|
| | Temperature (° C.) | Pressure (hPa) | Starting material composition (mol %) | | | Time (min) |
| | | | CO | $CO_2$ | $H_2$ | |
| Invention product 15 | 1000 | 55 | 0.3 | 0.5 | 99.2 | 2 |
| Invention product 16 | 1000 | 55 | 0.3 | 0.5 | 99.2 | 2 |
| Invention product 17 | 1000 | 55 | 0.3 | 0.5 | 99.2 | 2 |
| Invention product 18 | 1000 | 55 | 0.3 | 0.5 | 99.2 | 2 |
| Invention product 19 | 1000 | 55 | 0.3 | 0.5 | 99.2 | 2 |
| Invention product 20 | 1000 | 55 | 0.3 | 0.5 | 99.2 | 2 |
| Comparative product 1 | 1000 | 55 | 0 | 0.5 | 99.5 | 1 |
| Comparative product 2 | 1000 | 55 | 0.3 | 0.5 | 99.2 | 2 |
| Comparative product 3 | 1000 | 55 | 0.3 | 0.5 | 99.2 | 2 |
| Comparative product 4 | 1000 | 55 | 0.3 | 0.5 | 99.2 | 2 |
| Comparative product 5 | 1000 | 55 | 0 | 0.5 | 99.5 | 1 |
| Comparative product 6 | 1000 | 55 | 0 | 0.5 | 99.5 | 1 |
| Comparative product 7 | 1000 | 55 | 0 | 0.5 | 99.5 | 1 |
| Comparative product 8 | 1000 | 55 | 0 | 0.5 | 99.5 | 1 |
| Comparative product 9 | 1000 | 55 | 0.3 | 0.5 | 99.2 | 2 |
| Comparative product 10 | 1000 | 55 | 0.3 | 0.5 | 99.2 | 2 |
| Comparative product 11 | 1000 | 55 | 0.3 | 0.5 | 99.2 | 2 |

TABLE 3

| | Intermediate layer (Nuclei formation step) | | | | | | |
|---|---|---|---|---|---|---|---|
| | Temperature (° C.) | Pressure (hPa) | Starting material composition (mol %) | | | | |
| | | | $AlCl_3$ | CO | $CO_2$ | HCl | $H_2$ |
| Invention product 1 | 900 | 70 | 2.0 | 1.0 | 1.5 | 2.5 | 93.0 |
| Invention product 2 | 920 | 70 | 2.5 | 0.5 | 2.0 | 2.5 | 92.5 |
| Invention product 3 | 920 | 70 | 2.5 | 1.5 | 2.0 | 2.5 | 91.5 |
| Invention product 4 | 900 | 70 | 2.0 | 1.0 | 1.5 | 2.5 | 93.0 |
| Invention product 5 | 900 | 70 | 2.0 | 1.0 | 1.5 | 2.5 | 93.0 |
| Invention product 6 | 900 | 70 | 2.0 | 1.0 | 1.5 | 2.5 | 93.0 |
| Invention product 7 | 900 | 70 | 2.0 | 1.0 | 1.5 | 2.5 | 93.0 |
| Invention product 8 | 900 | 70 | 2.0 | 1.0 | 1.5 | 2.5 | 93.0 |
| Invention product 9 | 900 | 70 | 2.0 | 1.0 | 1.5 | 2.5 | 93.0 |
| Invention product 10 | 900 | 70 | 2.0 | 1.0 | 1.5 | 2.5 | 93.0 |
| Invention product 11 | 900 | 70 | 2.0 | 1.0 | 1.5 | 2.5 | 93.0 |
| Invention product 12 | 900 | 70 | 2.0 | 1.0 | 1.5 | 2.5 | 93.0 |
| Invention product 13 | 900 | 70 | 2.0 | 1.0 | 1.5 | 2.5 | 93.0 |
| Invention product 14 | 900 | 70 | 2.0 | 1.0 | 1.5 | 2.5 | 93.0 |
| Invention product 15 | 900 | 70 | 2.0 | 1.0 | 1.5 | 2.5 | 93.0 |
| Invention product 16 | 900 | 70 | 2.0 | 1.0 | 1.5 | 2.5 | 93.0 |
| Invention product 17 | 900 | 70 | 2.0 | 1.0 | 1.5 | 2.5 | 93.0 |
| Invention product 18 | 900 | 70 | 2.0 | 1.0 | 1.5 | 2.5 | 93.0 |
| Invention product 19 | 900 | 70 | 2.0 | 1.0 | 1.5 | 2.5 | 93.0 |
| Invention product 20 | 900 | 70 | 2.0 | 1.0 | 1.5 | 2.5 | 93.0 |
| Comparative product 1 | 1000 | 70 | 2.5 | 0.0 | 1.0 | 2.5 | 94.0 |
| Comparative product 2 | 900 | 70 | 2.0 | 1.0 | 1.5 | 2.5 | 93.0 |
| Comparative product 3 | 900 | 70 | 2.0 | 1.0 | 1.5 | 2.5 | 93.0 |
| Comparative product 4 | 900 | 70 | 2.0 | 1.0 | 1.5 | 2.5 | 93.0 |
| Comparative product 5 | 1000 | 70 | 2.5 | 0.0 | 1.0 | 2.5 | 94.0 |
| Comparative product 6 | 1000 | 70 | 2.5 | 0.0 | 1.0 | 2.5 | 94.0 |
| Comparative product 7 | 1000 | 70 | 2.5 | 0.0 | 1.0 | 2.5 | 94.0 |
| Comparative product 8 | 1000 | 70 | 2.5 | 0.0 | 1.0 | 2.5 | 94.0 |
| Comparative product 9 | 900 | 70 | 2.0 | 1.0 | 1.5 | 2.5 | 93.0 |
| Comparative product 10 | 900 | 70 | 2.0 | 1.0 | 1.5 | 2.5 | 93.0 |
| Comparative product 11 | 900 | 70 | 2.0 | 1.0 | 1.5 | 2.5 | 93.0 |

TABLE 4

| | Intermediate layer (Film deposition step) | | | | | | |
|---|---|---|---|---|---|---|---|
| | Temperature (° C.) | Pressure (hPa) | Starting material composition (mol %) | | | | |
| | | | $AlCl_3$ | $CO_2$ | HCl | $H_2S$ | $H_2$ |
| Invention product 1 | 990 | 70 | 3.0 | 3.0 | 2.5 | 0.20 | 91.3 |
| Invention product 2 | 990 | 70 | 3.0 | 3.0 | 2.5 | 0.20 | 91.3 |
| Invention product 3 | 990 | 70 | 3.0 | 3.0 | 2.5 | 0.20 | 91.3 |
| Invention product 4 | 990 | 70 | 3.0 | 3.0 | 2.5 | 0.20 | 91.3 |
| Invention product 5 | 990 | 70 | 3.0 | 3.0 | 2.5 | 0.20 | 91.3 |

TABLE 4-continued

| | Intermediate layer (Film deposition step) | | | | | | |
|---|---|---|---|---|---|---|---|
| | Temperature | Pressure | Starting material composition (mol %) | | | | |
| | (° C.) | (hPa) | AlCl$_3$ | CO$_2$ | HCl | H$_2$S | H$_2$ |
| Invention product 6 | 990 | 70 | 3.0 | 3.0 | 2.5 | 0.20 | 91.3 |
| Invention product 7 | 990 | 70 | 3.0 | 3.0 | 2.5 | 0.20 | 91.3 |
| Invention product 8 | 990 | 70 | 3.0 | 3.0 | 2.5 | 0.20 | 91.3 |
| Invention product 9 | 990 | 70 | 3.0 | 3.0 | 2.5 | 0.20 | 91.3 |
| Invention product 10 | 990 | 70 | 3.0 | 3.0 | 2.5 | 0.20 | 91.3 |
| Invention product 11 | 990 | 70 | 3.0 | 3.0 | 2.5 | 0.20 | 91.3 |
| Invention product 12 | 990 | 70 | 3.0 | 3.0 | 2.5 | 0.20 | 91.3 |
| Invention product 13 | 990 | 70 | 3.0 | 3.0 | 2.5 | 0.20 | 91.3 |
| Invention product 14 | 990 | 70 | 3.0 | 3.0 | 2.5 | 0.20 | 91.3 |
| Invention product 15 | 990 | 70 | 3.0 | 3.0 | 2.5 | 0.20 | 91.3 |
| Invention product 16 | 990 | 70 | 3.0 | 3.0 | 2.5 | 0.20 | 91.3 |
| Invention product 17 | 990 | 70 | 3.0 | 3.0 | 2.5 | 0.20 | 91.3 |
| Invention product 18 | 990 | 70 | 3.0 | 3.0 | 2.5 | 0.20 | 91.3 |
| Invention product 19 | 990 | 70 | 3.0 | 3.0 | 2.5 | 0.20 | 91.3 |
| Invention product 20 | 990 | 70 | 3.0 | 3.0 | 2.5 | 0.20 | 91.3 |
| Comparative product 1 | 990 | 70 | 3.0 | 3.0 | 2.5 | 0.20 | 91.3 |
| Comparative product 2 | 990 | 70 | 3.0 | 3.0 | 2.5 | 0.20 | 91.3 |
| Comparative product 3 | 990 | 70 | 3.0 | 3.0 | 2.5 | 0.20 | 91.3 |
| Comparative product 4 | 990 | 70 | 3.0 | 3.0 | 2.5 | 0.20 | 91.3 |
| Comparative product 5 | 990 | 70 | 3.0 | 3.0 | 2.5 | 0.20 | 91.3 |
| Comparative product 6 | 990 | 70 | 3.0 | 3.0 | 2.5 | 0.20 | 91.3 |
| Comparative product 7 | 990 | 70 | 3.0 | 3.0 | 2.5 | 0.20 | 91.3 |
| Comparative product 8 | 990 | 70 | 3.0 | 3.0 | 2.5 | 0.20 | 91.3 |
| Comparative product 9 | 990 | 70 | 3.0 | 3.0 | 2.5 | 0.20 | 91.3 |
| Comparative product 10 | 990 | 70 | 3.0 | 3.0 | 2.5 | 0.20 | 91.3 |
| Comparative product 11 | 990 | 70 | 3.0 | 3.0 | 2.5 | 0.20 | 91.3 |

TABLE 5

| | Upper layer | | | | | | | | |
|---|---|---|---|---|---|---|---|---|---|
| | Temperature | Pressure | Starting material composition (mol %) | | | | | | |
| | (° C.) | (hPa) | TiCl$_4$ | CH$_3$CN | CH$_4$ | C$_2$H$_4$ | CO | N$_2$ | H$_2$ |
| Invention product 1 | 1000 | 70 | 6.0 | 1.0 | 0.0 | 0.0 | 0.0 | 5.0 | 88.0 |
| Invention product 2 | 1000 | 70 | 6.0 | 1.2 | 0.0 | 0.0 | 0.0 | 5.0 | 87.8 |
| Invention product 3 | 1000 | 70 | 6.0 | 0.8 | 0.0 | 0.0 | 0.0 | 5.0 | 88.2 |
| Invention product 4 | 950 | 70 | 6.0 | 0.7 | 0.0 | 0.0 | 0.0 | 5.0 | 88.3 |
| Invention product 5 | 1050 | 70 | 6.0 | 2.0 | 0.0 | 0.0 | 0.0 | 5.0 | 87.0 |
| Invention product 6 | 1000 | 70 | 6.0 | 1.0 | 0.0 | 0.0 | 0.0 | 5.0 | 88.0 |
| Invention product 7 | 1000 | 70 | 6.0 | 1.0 | 0.0 | 0.0 | 0.0 | 5.0 | 88.0 |
| Invention product 8 | 1000 | 70 | 6.0 | 1.0 | 0.0 | 0.0 | 0.0 | 5.0 | 88.0 |
| Invention product 9 | 1000 | 70 | 6.0 | 1.0 | 0.0 | 0.0 | 0.0 | 5.0 | 88.0 |
| Invention product 10 | 1000 | 70 | 6.0 | 1.0 | 0.0 | 0.0 | 0.0 | 5.0 | 88.0 |
| Invention product 11 | 1000 | 70 | 6.0 | 1.0 | 0.0 | 0.0 | 0.0 | 5.0 | 88.0 |
| Invention product 12 | 1000 | 70 | 6.0 | 0.5 | 0.0 | 1.8 | 0.0 | 3.0 | 88.7 |
| Invention product 13 | 1020 | 70 | 6.0 | 0.8 | 0.0 | 0.0 | 0.0 | 20.0 | 73.2 |
| Invention product 14 | 1000 | 70 | 6.0 | 1.0 | 0.0 | 0.0 | 0.0 | 5.0 | 88.0 |
| Invention product 15 | 1000 | 70 | 6.0 | 1.0 | 0.0 | 0.0 | 0.0 | 5.0 | 88.0 |
| Invention product 16 | 1000 | 70 | 6.0 | 1.0 | 0.0 | 0.0 | 1.5 | 5.0 | 86.5 |
| Invention product 17 | 1020 | 70 | 6.0 | 0.8 | 0.0 | 0.0 | 2.5 | 20.0 | 70.7 |
| Invention product 18 | 1000 | 70 | 6.0 | 1.0 | 0.0 | 0.0 | 3.2 | 5.0 | 84.8 |
| Invention product 19 | 1000 | 70 | 6.0 | 0.5 | 0.0 | 1.8 | 1.5 | 3.0 | 87.2 |
| Invention product 20 | 1000 | 70 | 6.0 | 1.0 | 0.0 | 0.0 | 0.7 | 5.0 | 87.3 |
| Comparative product 1 | 1000 | 70 | 6.0 | 1.0 | 0.0 | 0.0 | 0.0 | 5.0 | 88.0 |
| Comparative product 2 | 1000 | 70 | 6.0 | 0.0 | 1.5 | 0.0 | 0.0 | 15.0 | 77.5 |
| Comparative product 3 | 1000 | 70 | 6.0 | 1.0 | 0.0 | 0.0 | 0.0 | 5.0 | 88.0 |
| Comparative product 4 | 1000 | 350 | 7.5 | 0.0 | 0.0 | 0.0 | 0.0 | 40.0 | 52.5 |
| Comparative product 5 | 1000 | 70 | 6.0 | 0.0 | 1.5 | 0.0 | 0.0 | 15.0 | 77.5 |
| Comparative product 6 | 1000 | 70 | 6.0 | 0.0 | 1.5 | 0.0 | 0.0 | 15.0 | 77.5 |
| Comparative product 7 | 1000 | 70 | 6.0 | 0.0 | 1.5 | 0.0 | 1.5 | 15.0 | 76.0 |
| Comparative product 8 | 1000 | 70 | 6.0 | 0.0 | 1.5 | 0.0 | 1.5 | 15.0 | 76.0 |
| Comparative product 9 | 1000 | 70 | 6.0 | 1.0 | 1.5 | 0.0 | 3.2 | 15.0 | 73.3 |
| Comparative product 10 | 1000 | 70 | 6.0 | 1.0 | 0.0 | 0.0 | 0.0 | 5.0 | 88.0 |
| Comparative product 11 | 1000 | 70 | 6.0 | 1.0 | 0.0 | 0.0 | 3.2 | 5.0 | 84.8 |

TABLE 6

| | Coating layer | | | | | | | | |
|---|---|---|---|---|---|---|---|---|---|
| | Lower layer | | | | | | Intermediate layer | | |
| | 1st layer | | 2nd layer | | 3rd layer | | Thickness of entire lower layer (μm) | | |
| | Composition | Average thickness (μm) | Composition | Average thickness (μm) | Composition | Average thickness (μm) | | Composition | Crystal system | Average thickness (μm) |
| Invention product 1 | TiN | 0.3 | TiCN | 5.0 | TiCNO | 0.2 | 5.5 | $Al_2O_3$ | α | 8.0 |
| Invention product 2 | TiN | 0.3 | TiCN | 5.0 | TiCNO | 0.2 | 5.5 | $Al_2O_3$ | α | 8.0 |
| Invention product 3 | TiN | 0.3 | TiCN | 5.0 | TiCNO | 0.2 | 5.5 | $Al_2O_3$ | α | 8.0 |
| Invention product 4 | TiN | 0.3 | TiCN | 5.0 | TiCNO | 0.2 | 5.5 | $Al_2O_3$ | α | 8.0 |
| Invention product 5 | TiN | 0.3 | TiCN | 5.0 | TiCNO | 0.2 | 5.5 | $Al_2O_3$ | α | 8.0 |
| Invention product 6 | TiN | 0.3 | TiCN | 5.0 | TiCNO | 0.2 | 5.5 | $Al_2O_3$ | α | 8.0 |
| Invention product 7 | TiN | 0.3 | TiCN | 5.0 | TiCNO | 0.2 | 5.5 | $Al_2O_3$ | α | 8.0 |
| Invention product 8 | TiN | 0.3 | TiCN | 5.0 | TiCNO | 0.2 | 5.5 | $Al_2O_3$ | α | 8.0 |
| Invention product 9 | TiN | 0.3 | TiCN | 10.5 | TiCNO | 0.2 | 11.0 | $Al_2O_3$ | α | 3.0 |
| Invention product 10 | TiC | 0.3 | TiCN | 5.0 | TiCNO | 0.2 | 5.5 | $Al_2O_3$ | α | 8.0 |
| Invention product 11 | TiN | 0.3 | TiCN | 5.0 | TiCO | 0.2 | 5.5 | $Al_2O_3$ | α | 8.0 |
| Invention product 12 | TiN | 0.3 | TiCN | 5.0 | TiCNO | 0.2 | 5.5 | $Al_2O_3$ | α | 8.0 |
| Invention product 13 | TiN | 0.3 | TiCN | 5.0 | TiCNO | 0.2 | 5.5 | $Al_2O_3$ | α | 8.0 |
| Invention product 14 | TiN | 0.3 | TiCN | 4.5 | TiCNO | 0.2 | 5.0 | $Al_2O_3$ | α | 4.5 |
| Invention product 15 | TiN | 0.3 | TiCN | 12.0 | TiCNO | 0.2 | 12.5 | $Al_2O_3$ | α | 10.0 |
| Invention product 16 | TiN | 0.3 | TiCN | 5.0 | TiCNO | 0.2 | 5.5 | $Al_2O_3$ | α | 8.0 |
| Invention product 17 | TiN | 0.3 | TiCN | 5.0 | TiCNO | 0.2 | 5.5 | $Al_2O_3$ | α | 8.0 |
| Invention product 18 | TiN | 0.3 | TiCN | 5.0 | TiCNO | 0.2 | 5.5 | $Al_2O_3$ | α | 8.0 |
| Invention product 19 | TiN | 0.3 | TiCN | 5.0 | TiCNO | 0.2 | 5.5 | $Al_2O_3$ | α | 8.0 |
| Invention product 20 | TiN | 0.3 | TiCN | 5.0 | TiCNO | 0.2 | 5.5 | $Al_2O_3$ | α | 8.0 |
| Comparative product 1 | TiN | 0.3 | TiCN | 5.0 | TiCNO | 0.2 | 5.5 | $Al_2O_3$ | α | 8.0 |
| Comparative product 2 | TiN | 0.3 | TiCN | 5.0 | TiCNO | 0.2 | 5.5 | $Al_2O_3$ | α | 8.0 |
| Comparative product 3 | TiN | 0.3 | TiCN | 15.0 | TiCNO | 0.2 | 15.5 | $Al_2O_3$ | α | 15.0 |
| Comparative product 4 | TiN | 0.3 | TiCN | 5.0 | TiCNO | 0.2 | 5.5 | $Al_2O_3$ | α | 8.0 |
| Comparative product 5 | TiN | 0.3 | TiCN | 5.0 | TiCNO | 0.2 | 5.5 | $Al_2O_3$ | α | 8.0 |
| Comparative product 6 | TiN | 0.3 | TiCN | 5.0 | TiCNO | 0.2 | 5.5 | $Al_2O_3$ | α | 8.0 |
| Comparative product 7 | TiN | 0.3 | TiCN | 10.5 | TiCNO | 0.2 | 11.0 | $Al_2O_3$ | α | 2.5 |
| Comparative product 8 | TiN | 0.3 | TiCN | 4.5 | TiCNO | 0.2 | 5.0 | $Al_2O_3$ | α | 4.5 |
| Comparative product 9 | TiN | 0.3 | TiCN | 5.0 | TiCNO | 0.2 | 5.5 | $Al_2O_3$ | α | 8.0 |
| Comparative product 10 | TiN | 0.3 | TiCN | 5.0 | TiCNO | 0.2 | 5.5 | $Al_2O_3$ | α | 8.0 |
| Comparative product 11 | TiN | 0.3 | TiCN | 5.0 | TiCNO | 0.2 | 5.5 | $Al_2O_3$ | α | 8.0 |

| | Coating layer | | | | |
|---|---|---|---|---|---|
| | Upper layer | | Outermost layer | | Thickness of entire coating layer (μm) |
| | Composition | Average thickness (μm) | Composition | Average thickness (μm) | |
| Invention product 1 | $Ti(C_{0.60}N_{0.40})$ | 3.0 | TiN | 0.3 | 16.8 |
| Invention product 2 | $Ti(C_{0.60}N_{0.40})$ | 3.0 | TiN | 0.3 | 16.8 |
| Invention product 3 | $Ti(C_{0.60}N_{0.40})$ | 3.0 | TiN | 0.3 | 16.8 |
| Invention product 4 | $Ti(C_{0.60}N_{0.40})$ | 3.0 | TiN | 0.3 | 16.8 |
| Invention product 5 | $Ti(C_{0.60}N_{0.40})$ | 3.0 | TiN | 0.3 | 16.8 |
| Invention product 6 | $Ti(C_{0.60}N_{0.40})$ | 1.4 | — | | 14.9 |
| Invention product 7 | $Ti(C_{0.60}N_{0.40})$ | 4.0 | — | | 17.5 |
| Invention product 8 | $Ti(C_{0.60}N_{0.40})$ | 5.8 | — | | 19.3 |
| Invention product 9 | $Ti(C_{0.60}N_{0.40})$ | 3.0 | — | | 17.0 |
| Invention product 10 | $Ti(C_{0.60}N_{0.40})$ | 3.0 | — | | 16.5 |
| Invention product 11 | $Ti(C_{0.60}N_{0.40})$ | 3.0 | — | | 16.5 |
| Invention product 12 | $Ti(C_{0.70}N_{0.30})$ | 3.0 | TiN | 0.3 | 16.8 |
| Invention product 13 | $Ti(C_{0.45}N_{0.55})$ | 3.0 | TiN | 0.3 | 16.8 |
| Invention product 14 | $Ti(C_{0.60}N_{0.40})$ | 3.0 | — | | 12.5 |
| Invention product 15 | $Ti(C_{0.60}N_{0.40})$ | 3.0 | — | | 25.5 |
| Invention product 16 | $Ti(C_{0.55}N_{0.40}O_{0.05})$ | 3.0 | TiN | 0.3 | 16.8 |
| Invention product 17 | $Ti(C_{0.30}N_{0.60}O_{0.10})$ | 3.0 | TiN | 0.3 | 16.8 |
| Invention product 18 | $Ti(C_{0.55}N_{0.30}O_{0.15})$ | 3.0 | TiN | 0.3 | 16.8 |
| Invention product 19 | $Ti(C_{0.75}N_{0.20}O_{0.05})$ | 3.0 | TiN | 0.3 | 16.8 |
| Invention product 20 | $Ti(C_{0.57}N_{0.40}O_{0.03})$ | 3.0 | TiN | 0.3 | 16.8 |
| Comparative product 1 | $Ti(C_{0.60}N_{0.40})$ | 3.0 | TiN | 0.3 | 16.8 |
| Comparative product 2 | $Ti(C_{0.60}N_{0.40})$ | 3.0 | TiN | 0.3 | 16.8 |
| Comparative product 3 | $Ti(C_{0.60}N_{0.40})$ | 3.0 | — | | 33.5 |
| Comparative product 4 | TiN | 3.0 | — | | 16.5 |
| Comparative product 5 | $Ti(C_{0.60}N_{0.40})$ | 3.0 | — | | 16.5 |
| Comparative product 6 | $Ti(C_{0.60}N_{0.40})$ | 4.0 | — | | 17.5 |
| Comparative product 7 | $Ti(C_{0.55}N_{0.40}O_{0.05})$ | 3.0 | — | | 16.5 |
| Comparative product 8 | $Ti(C_{0.55}N_{0.40}O_{0.05})$ | 3.0 | — | | 12.5 |
| Comparative product 9 | $Ti(C_{0.55}N_{0.30}O_{0.15})$ | 3.0 | TiN | 0.3 | 16.8 |

TABLE 6-continued

|  |  |  |  |  |
|---|---|---|---|---|
| Comparative product 10 | Ti(C$_{0.60}$N$_{0.40}$) | 3.0 | TiN | 0.3 | 16.8 |
| Comparative product 11 | Ti(C$_{0.55}$N$_{0.30}$O$_{0.15}$) | 3.0 | TiN | 0.3 | 16.8 |

TABLE 7

| | Intermediate layer Area ratio (area %) *1 | | | | Upper layer Area ratio (area %) *2 | | | |
|---|---|---|---|---|---|---|---|---|
| | 0° ≤ A < 10° (RSA) | 10° ≤ A < 20° | 20° ≤ A < 30° | 30° ≤ A ≤ 45° | 0° ≤ B < 10° (RSB) | 10° ≤ B < 20° | 20° ≤ B < 30° | 30° ≤ B ≤ 45° |
| Invention product 1 | 62 | 12 | 11 | 15 | 50 | 15 | 12 | 23 |
| Invention product 2 | 43 | 22 | 18 | 17 | 49 | 20 | 16 | 15 |
| Invention product 3 | 70 | 9 | 7 | 14 | 55 | 13 | 11 | 21 |
| Invention product 4 | 61 | 14 | 11 | 14 | 40 | 24 | 20 | 16 |
| Invention product 5 | 62 | 12 | 9 | 17 | 71 | 12 | 11 | 6 |
| Invention product 6 | 63 | 11 | 11 | 15 | 52 | 16 | 14 | 18 |
| Invention product 7 | 62 | 13 | 11 | 14 | 52 | 17 | 13 | 18 |
| Invention product 8 | 63 | 11 | 10 | 16 | 53 | 15 | 16 | 16 |
| Invention product 9 | 60 | 17 | 13 | 10 | 50 | 15 | 12 | 23 |
| Invention product 10 | 61 | 14 | 10 | 15 | 52 | 18 | 15 | 15 |
| Invention product 11 | 62 | 13 | 10 | 15 | 51 | 17 | 16 | 16 |
| Invention product 12 | 61 | 13 | 14 | 12 | 51 | 14 | 12 | 23 |
| Invention product 13 | 62 | 13 | 12 | 13 | 52 | 14 | 13 | 21 |
| Invention product 14 | 63 | 14 | 11 | 12 | 53 | 14 | 13 | 20 |
| Invention product 15 | 63 | 14 | 10 | 13 | 52 | 16 | 15 | 17 |
| Invention product 16 | 62 | 12 | 10 | 16 | 51 | 16 | 13 | 20 |
| Invention product 17 | 61 | 13 | 11 | 15 | 53 | 15 | 13 | 19 |
| Invention product 18 | 63 | 12 | 9 | 16 | 51 | 18 | 13 | 18 |
| Invention product 19 | 62 | 13 | 11 | 14 | 52 | 14 | 11 | 23 |
| Invention product 20 | 63 | 13 | 10 | 14 | 53 | 15 | 10 | 22 |
| Comparative product 1 | 22 | 22 | 24 | 32 | 51 | 16 | 13 | 20 |
| Comparative product 2 | 61 | 13 | 10 | 16 | 25 | 21 | 23 | 31 |
| Comparative product 3 | 62 | 12 | 11 | 15 | 53 | 14 | 11 | 22 |
| Comparative product 4 | 61 | 14 | 12 | 13 | 52 | 16 | 13 | 19 |
| Comparative product 5 | 22 | 24 | 20 | 34 | 20 | 24 | 17 | 39 |
| Comparative product 6 | 20 | 18 | 16 | 46 | 22 | 20 | 19 | 39 |
| Comparative product 7 | 20 | 20 | 24 | 36 | 20 | 21 | 18 | 41 |
| Comparative product 8 | 21 | 18 | 17 | 44 | 21 | 25 | 20 | 34 |
| Comparative product 9 | 62 | 13 | 10 | 15 | 22 | 23 | 21 | 34 |
| Comparative product 10 | 61 | 13 | 12 | 14 | 52 | 16 | 13 | 19 |
| Comparative product 11 | 62 | 14 | 11 | 13 | 50 | 18 | 14 | 18 |

*1 "A" denotes misorientation A defined in the description
*2 "B" denotes misorientation B defined in the description

TABLE 8

| | Exposed layer of coating layer | | |
|---|---|---|---|
| | Honing section | Rake face | Flank face |
| Invention product 1 | Intermediate layer | Outermost layer | Outermost layer |
| Invention product 2 | Intermediate layer | Outermost layer | Outermost layer |
| Invention product 3 | Intermediate layer | Outermost layer | Outermost layer |
| Invention product 4 | Intermediate layer | Outermost layer | Outermost layer |
| Invention product 5 | Intermediate layer | Outermost layer | Outermost layer |
| Invention product 6 | Intermediate layer | Upper layer | Upper layer |
| Invention product 7 | Intermediate layer | Upper layer | Upper layer |
| Invention product 8 | Intermediate layer | Upper layer | Upper layer |
| Invention product 9 | Intermediate layer | Upper layer | Upper layer |
| Invention product 10 | Intermediate layer | Intermediate layer | Upper layer |
| Invention product 11 | Intermediate layer | Intermediate layer | Upper layer |
| Invention product 12 | Intermediate layer | Outermost layer | Outermost layer |
| Invention product 13 | Intermediate layer | Outermost layer | Outermost layer |
| Invention product 14 | Intermediate layer | Intermediate layer | Upper layer |
| Invention product 15 | Intermediate layer | Intermediate layer | Upper layer |
| Invention product 16 | Intermediate layer | Outermost layer | Outermost layer |
| Invention product 17 | Intermediate layer | Outermost layer | Outermost layer |
| Invention product 18 | Intermediate layer | Outermost layer | Outermost layer |
| Invention product 19 | Intermediate layer | Outermost layer | Outermost layer |
| Invention product 20 | Intermediate layer | Outermost layer | Outermost layer |
| Comparative product 1 | Outermost layer | Outermost layer | Outermost layer |
| Comparative product 2 | Intermediate layer | Outermost layer | Outermost layer |
| Comparative product 3 | Intermediate layer | Upper layer | Upper layer |

TABLE 8-continued

|  | Exposed layer of coating layer | | |
|---|---|---|---|
|  | Honing section | Rake face | Flank face |
| Comparative product 4 | Intermediate layer | Upper layer | Upper layer |
| Comparative product 5 | Intermediate layer | Upper layer | Upper layer |
| Comparative product 6 | Intermediate layer | Upper layer | Upper layer |
| Comparative product 7 | Upper layer | Upper layer | Upper layer |
| Comparative product 8 | Upper layer | Upper layer | Upper layer |
| Comparative product 9 | Intermediate layer | Outermost layer | Outermost layer |
| Comparative product 10 | Outermost layer | Outermost layer | Outermost layer |
| Comparative product 11 | Outermost layer | Outermost layer | Outermost layer |

Cutting test 1 and Cutting test 2 were carried out under the conditions below, using Invention products 1 to 20 and Comparative products 1 to 11 thus obtained. The results of the cutting tests are given in Table 9.

—Cutting Test 1—
Substrate: substrate 1
Workpiece: S45C round bar with four grooves
Cutting speed: 100 m/min
Feed: 0.25 mm/rev
Depth of cut: 1.5 mm
Coolant: yes
Evaluation items: the point in time at which at least part of sample fractured or a maximum flank wear width reached 0.3 mm was defined as the tool life, and the number of impacts up to the end of the tool life were measured; the results are given in Table 9. Damage at a 10000th impact was checked and set out in Table 9. The number of impacts was set to 17000 impacts.

No chipping occurred by the 10000th impact in Invention products 1 to 20.

Cutting Test 2
Substrate: substrate 2
Workpiece: FCD400 round bar
Cutting speed: 400 m/min
Feed: 0.30 mm/rev
Depth of cut: 1.0 mm
Machining time: 10 minutes
Coolant: yes
Evaluation items: the state of welding of the workpiece to the honing section after machining and the state of the machined surface of the workpiece were observed. The wear width of the flank face of each machined sample was measured.

TABLE 9

|  | Coating layer | | | | | | Cutting test (2) | | |
|---|---|---|---|---|---|---|---|---|---|
|  | Intermediate layer | Upper layer | | Thickness of entire coating layer (μm) | Intermediate layer exposed at honed section | Cutting test (1) | | Welded state at honed section after machining | State of machined surface of workpiece | Wear width of flank face (mm) |
|  | RSA (area %) | Material | RSB (area %) | | | Damage after 10000 impacts | Tool life (impacts) | | | |
| Invention product 1 | 62 | Ti($C_{0.60}N_{0.40}$) | 50 | 16.8 | Yes | Normal wear | 16100 | Very small amount | Good | 0.16 |
| Invention product 2 | 43 | Ti($C_{0.60}N_{0.40}$) | 49 | 16.8 | Yes | Normal wear | 16200 | Very small amount | Good | 0.16 |
| Invention product 3 | 70 | Ti($C_{0.60}N_{0.40}$) | 55 | 16.8 | Yes | Normal wear | 16400 | Very small amount | Good | 0.17 |
| Invention product 4 | 61 | Ti($C_{0.60}N_{0.40}$) | 40 | 16.8 | Yes | Normal wear | 15500 | Very small amount | Good | 0.17 |
| Invention product 5 | 62 | Ti($C_{0.60}N_{0.40}$) | 71 | 16.8 | Yes | Normal wear | 17000 | Very small amount | Good | 0.16 |
| Invention product 6 | 63 | Ti($C_{0.60}N_{0.40}$) | 52 | 14.9 | Yes | Normal wear | 15300 | Very small amount | Good | 0.15 |
| Invention product 7 | 62 | Ti($C_{0.60}N_{0.40}$) | 52 | 17.5 | Yes | Normal wear | 16000 | Very small amount | Good | 0.14 |
| Invention product 8 | 63 | Ti($C_{0.60}N_{0.40}$) | 53 | 19.3 | Yes | Normal wear | 15600 | Very small amount | Good | 0.13 |
| Invention product 9 | 60 | Ti($C_{0.60}N_{0.40}$) | 50 | 17.0 | Yes | Normal wear | 16400 | Very small amount | Good | 0.14 |
| Invention product 10 | 61 | Ti($C_{0.60}N_{0.40}$) | 52 | 16.5 | Yes | Normal wear | 16000 | None | Very good | 0.13 |
| Invention product 11 | 62 | Ti($C_{0.60}N_{0.40}$) | 51 | 16.5 | Yes | Normal wear | 15800 | None | Very good | 0.14 |
| Invention product 12 | 61 | Ti($C_{0.70}N_{0.30}$) | 51 | 16.8 | Yes | Normal wear | 15300 | Very small amount | Good | 0.15 |
| Invention product 13 | 62 | Ti($C_{0.45}N_{0.55}$) | 52 | 16.8 | Yes | Normal wear | 16100 | Very small amount | Good | 0.18 |
| Invention product 14 | 63 | Ti($C_{0.60}N_{0.40}$) | 53 | 12.5 | Yes | Normal wear | 16000 | None | Very good | 0.14 |

TABLE 9-continued

| | Coating layer | | | | | Cutting test (2) | | | |
|---|---|---|---|---|---|---|---|---|---|
| | Intermediate layer | Upper layer | | Thickness of entire coating layer (μm) | Intermediate layer exposed at honed section | Cutting test (1) | | Welded state at honed section after machining | Wear width of flank face (mm) |
| | RSA (area %) | Material | RSB (area %) | | | Damage after 10000 impacts | Tool life (impacts) | State of machined surface of workpiece | |
| Invention product 15 | 63 | Ti(C$_{0.60}$N$_{0.40}$) | 52 | 25.5 | Yes | Normal wear | 14500 | None | Very good | 0.13 |
| Invention product 16 | 62 | Ti(C$_{0.55}$N$_{0.40}$O$_{0.05}$) | 51 | 16.8 | Yes | Normal wear | 16100 | Very small amount | Good | 0.16 |
| Invention product 17 | 61 | Ti(C$_{0.30}$N$_{0.60}$O$_{0.10}$) | 53 | 16.8 | Yes | Normal wear | 16100 | Very small amount | Good | 0.15 |
| Invention product 18 | 63 | Ti(C$_{0.55}$N$_{0.30}$O$_{0.15}$) | 51 | 16.8 | Yes | Normal wear | 16300 | None | Very good | 0.15 |
| Invention product 19 | 62 | Ti(C$_{0.75}$N$_{0.20}$O$_{0.05}$) | 52 | 16.8 | Yes | Normal wear | 15300 | Very small amount | Good | 0.17 |
| Invention product 20 | 63 | Ti(C$_{0.57}$N$_{0.40}$O$_{0.03}$) | 53 | 16.8 | Yes | Normal wear | 15900 | Very small amount | Good | 0.17 |
| Comparative product 1 | 22 | Ti(C$_{0.60}$N$_{0.40}$) | 51 | 16.8 | No | Normal wear | 14000 | Large amount | White haze | 0.18 |
| Comparative product 2 | 61 | Ti(C$_{0.60}$N$_{0.40}$) | 25 | 16.8 | Yes | Chipping | 12400 | Very small amount | Good | 0.17 |
| Comparative product 3 | 62 | Ti(C$_{0.60}$N$_{0.40}$) | 53 | 33.5 | Yes | Fracture | 9700 | Large amount | White haze | 0.24 |
| Comparative product 4 | 61 | TiN | 52 | 16.5 | Yes | Chipping | 11200 | Very small amount | Good | 0.22 |
| Comparative product 5 | 22 | Ti(C$_{0.60}$N$_{0.40}$) | 20 | 16.5 | Yes | Chipping | 12800 | Very small amount | Good | 0.18 |
| Comparative product 6 | 20 | Ti(C$_{0.60}$N$_{0.40}$) | 22 | 17.5 | Yes | Chipping | 12700 | Very small amount | Good | 0.18 |
| Comparative product 7 | 20 | Ti(C$_{0.55}$N$_{0.40}$O$_{0.05}$) | 20 | 16.5 | No | Chipping | 12900 | Large amount | White haze | 0.20 |
| Comparative product 8 | 21 | Ti(C$_{0.55}$N$_{0.40}$O$_{0.05}$) | 21 | 12.5 | No | Normal wear | 12600 | Large amount | White haze | 0.21 |
| Comparative product 9 | 62 | Ti(C$_{0.55}$N$_{0.30}$O$_{0.15}$) | 22 | 16.8 | Yes | Chipping | 12000 | Very small amount | Good | 0.18 |
| Comparative product 10 | 61 | Ti(C$_{0.60}$N$_{0.40}$) | 52 | 16.8 | No | Normal wear | 14300 | Large amount | White haze | 0.19 |
| Comparative product 11 | 62 | Ti(C$_{0.55}$N$_{0.30}$O$_{0.15}$) | 50 | 16.8 | No | Normal wear | 14800 | Large amount | White haze | 0.18 |

In Comparative product 3, the sample fractured before 10000 impacts were reached, and hence the table indicates damage during the tool life.

The results revealed that the product of the invention had superior fracture resistance, and long tool life. The product of the invention allows preventing welding of the cut material to the honing section after machining; as a result, a machined surface of the workpiece was improved.

The coated cutting tool of the present invention exhibits long tool life, and exhibits superior machined surface quality, and hence the coated cutting tool is industrially applicable from these viewpoints.

What is claimed is:
1. A coated cutting tool, comprising:
   a substrate; and
   a coating layer formed on the substrate,
wherein,
   the coated cutting tool has at least one flank face, at least one rake face, and a honing section rounded and connecting the flank face and the rake face;
   the coating layer comprises:
      a lower layer;
      an intermediate layer; and
      an upper layer, in this order from the side of the substrate;
   the lower layer comprises one, or two or more Ti compound layers composed of a Ti compound of Ti and at least one element selected from the group consisting of C, N, O and B;
   the intermediate layer comprises α-type Al$_2$O$_3$,
   the upper layer comprises a compound represented by following formula (1):

$$\text{Ti}(\text{C}_{1-x-y}\text{N}_x\text{O}_y) \qquad (1)$$

wherein, x is the atomic ratio of N relative to the total of C, N and O; y is the atomic ratio of O relative to the total of C, N and O; and $0.15 \leq x \leq 0.65$ and $0 \leq y \leq 0.20$ are satisfied;
   an average thickness of the coating layer on the side of the flank face is 5.0 μm or more and 30.0 μm or less;
   a first cross section surface positioned in the intermediate layer at a distance of up to 1 μm towards the substrate, from an interface on the upper layer side, the cross section surface being parallel to an interface of the substrate and the lower layer, satisfies the condition represented by following expression (i):

$$\text{RSA} \geq 40 \qquad (i)$$

wherein, RSA is the proportion (units: area %) of cross-sectional area of particles having a misorientation A of 0 degrees or more and less than 10 degrees, relative to the cross-sectional area of particles having a misorientation A of 0 degrees or more and 45 degrees or less, in the first cross section surface; and the misorientation A is an angle (units: degrees) formed by the normal line of the first cross section surface and the normal line of the (001) plane of the particles of α-type $Al_2O_3$ in the intermediate layer;

a second cross section surface, positioned in the upper layer at a distance of up to 1 μm from the interface on the intermediate layer side towards an interface on the opposite side, the cross section being parallel to the interface of the substrate and the lower layer, satisfies the condition represented by following expression (ii):

$$RSB \geq 40 \quad \text{(ii)}$$

wherein, RSB is the proportion (units: area %) of cross-sectional area of particles having a misorientation B of 0 degrees or more and less than 10 degrees, relative to the cross-sectional area of particles having a misorientation B of 0 degrees or more and 45 degrees or less, in the second cross section surface; and the misorientation B is an angle (units: degrees) formed by the normal line of the second cross section surface and the normal line of the (111) plane of the particles of the compound represented by the formula (1) in the upper layer; and the intermediate layer is exposed at least at the honing section.

2. The coated cutting tool of claim 1, wherein the intermediate layer is exposed also at a region up to 3 mm from a boundary of the rake face and the honing section.

3. The coated cutting tool of claim 1, wherein an average thickness of the upper layer is 1.0 μm or more and 6.0 μm or less, on the side of the flank face.

4. The coated cutting tool of claim 1, wherein an average thickness of the intermediate layer is 3.0 μm or more and 15.0 μm or less, on the side of the flank face.

5. The coated cutting tool of claim 1, wherein an average thickness of the lower layer is 3.0 μm or more and 15.0 μm or less, on the side of the flank face.

6. The coated cutting tool of claim 1, wherein the Ti compound in the Ti compound layer is at least one selected from the group consisting of TiN, TiC, TiCN, TiCNO, TiON and $TiB_2$.

7. The coated cutting tool of claim 1, wherein the substrate is a cemented carbide, a cermet, a ceramic or a sintered compact of cubic boron nitride.

8. The coated cutting tool of claim 2, wherein an average thickness of the upper layer is 1.0 μm or more and 6.0 μm or less, on the side of the flank face.

9. The coated cutting tool of claim 2, wherein an average thickness of the intermediate layer is 3.0 μm or more and 15.0 μm or less, on the side of the flank face.

10. The coated cutting tool of claim 2, wherein an average thickness of the lower layer is 3.0 μm or more and 15.0 μm or less, on the side of the flank face.

11. The coated cutting tool of claim 2, wherein the Ti compound in the Ti compound layer is at least one selected from the group consisting of TiN, TiC, TiCN, TiCNO, TiON and $TiB_2$.

12. The coated cutting tool of claim 2, wherein the substrate is a cemented carbide, a cermet, a ceramic or a sintered compact of cubic boron nitride.

13. The coated cutting tool of claim 3, wherein an average thickness of the intermediate layer is 3.0 μm or more and 15.0 μm or less, on the side of the flank face.

14. The coated cutting tool of claim 3, wherein an average thickness of the lower layer is 3.0 μm or more and 15.0 μm or less, on the side of the flank face.

15. The coated cutting tool of claim 3, wherein the Ti compound in the Ti compound layer is at least one selected from the group consisting of TiN, TiC, TiCN, TiCNO, TiON and $TiB_2$.

16. The coated cutting tool of claim 3, wherein the substrate is a cemented carbide, a cermet, a ceramic or a sintered compact of cubic boron nitride.

17. The coated cutting tool of claim 4, wherein an average thickness of the lower layer is 3.0 μm or more and 15.0 μm or less, on the side of the flank face.

18. The coated cutting tool of claim 4, wherein the Ti compound in the Ti compound layer is at least one selected from the group consisting of TiN, TiC, TiCN, TiCNO, TiON and $TiB_2$.

19. The coated cutting tool of claim 4, wherein the substrate is a cemented carbide, a cermet, a ceramic or a sintered compact of cubic boron nitride.

* * * * *